United States Patent [19]

Kinzer

[11] Patent Number: 4,996,577

[45] Date of Patent: Feb. 26, 1991

[54] PHOTOVOLTAIC ISOLATOR AND PROCESS OF MANUFACTURE THEREOF

[75] Inventor: Daniel M. Kinzer, Riverside, Calif.

[73] Assignee: International Rectifier Corporation, El Segundo, Calif.

[21] Appl. No.: 474,625

[22] Filed: Jan. 29, 1990

Related U.S. Application Data

[63] Continuation of Ser. No. 573,305, Jan. 23, 1984, abandoned.

[51] Int. Cl.$^5$ ............................ H01L 27/14; H01L 31/00
[52] U.S. Cl. ............................................................ 357/30
[58] Field of Search ................ 357/30, 50; 136/244, 136/252, 255, 259; 250/208, 551

[56] References Cited

U.S. PATENT DOCUMENTS

| | | | |
|---|---|---|---|
| 4,244,750 | 1/1981 | Chenevas-Paule et al. | 357/30 |
| 4,255,211 | 3/1981 | Fraas | 357/30 |
| 4,256,513 | 3/1981 | Yoshida et al. | 357/30 |
| 4,268,843 | 5/1981 | Brown et al. | 357/30 |
| 4,409,422 | 10/1983 | Sater | 136/244 |

FOREIGN PATENT DOCUMENTS 1602889  11/1981  United Kingdom .

Primary Examiner—William L. Sikes
Assistant Examiner—Robert E. Wise
Attorney, Agent, or Firm—Ostrolenk, Faber, Gerb & Soffen

[57] ABSTRACT

A photovoltaic isolator consists of a stack of semiconductor wafers which are alloyed together by an aluminum silicon alloy foil. Each of the wafers consists of a very high resistivity P-type body having P+ and N+ diffusions on its opposite surfaces. The wafers are stacked with the same forward conduction polarity. Individual photoisolator stacks are sliced from the completed stack to any desired dimension. Each individual stack is mounted with a light source, preferably an LED, which is arranged to illuminate the edge of each wafer within the stack. The LED and stack are spaced by about 30 mils so that high dielectric isolation exists between the LED and photovoltaic stack. Energization of the LED will produce a relatively high output short circuit current from the stack and a high output voltage which can turn a power MOSFET on very quickly after the energization of the LED.

43 Claims, 3 Drawing Sheets

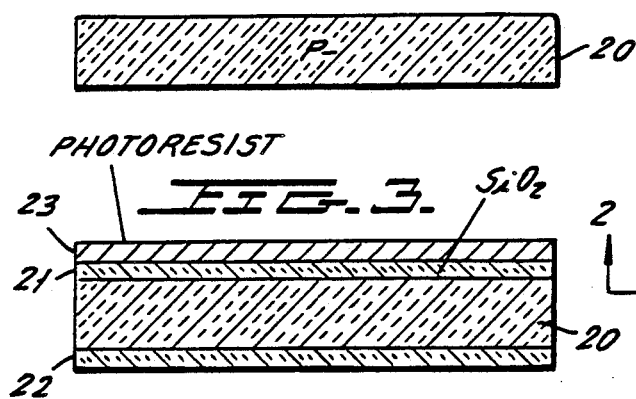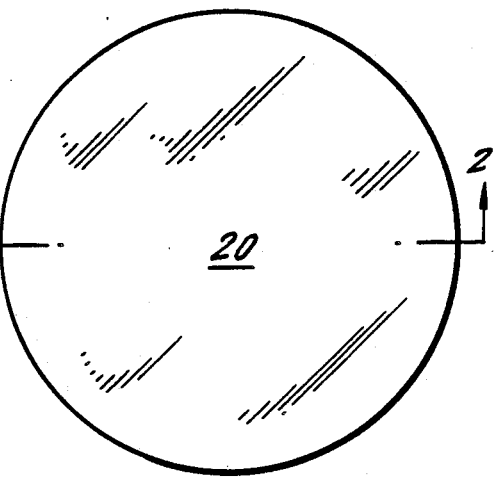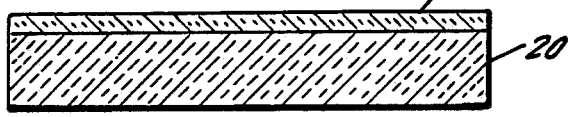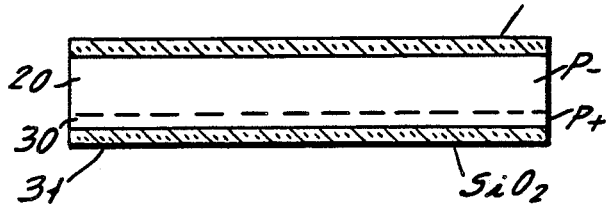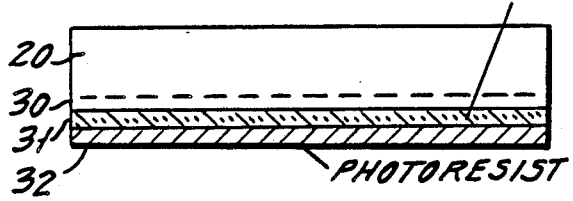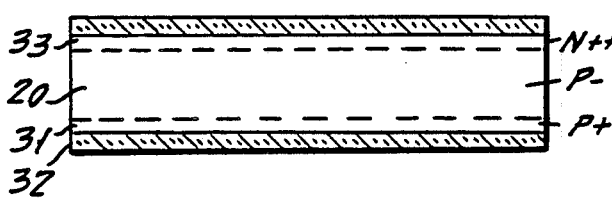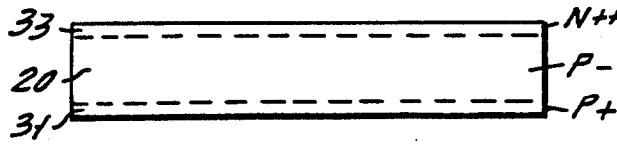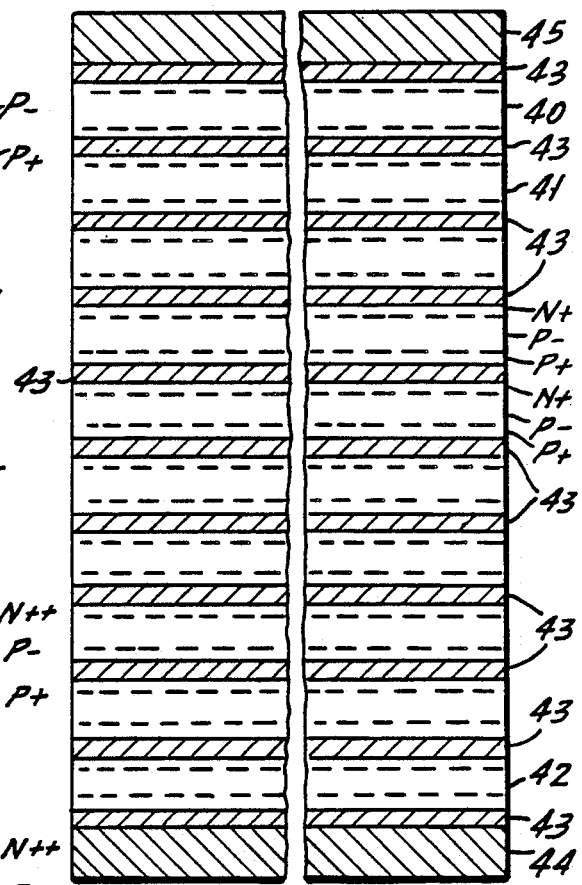

PHOTOVOLTAIC ISOLATOR AND PROCESS OF MANUFACTURE THEREOF

This is a continuation of application Ser. No. 06/573,305 filed on Jan. 23, 1984, now abandoned.

BACKGROUND OF THE INVENTION

This invention relates to photovoltaic isolators, sometimes termed "optocouplers", and more specifically relates to a component which employs a dielectrically isolated LED and a novel photovoltaic stack which is edge illuminated by the LED to produce an output voltage which can be employed in any desired switching function.

A photovoltaic isolator may serve as a voltage source which can turn on a power switching device such as a power metal oxide semiconductor field effect transistor (MOSFET), as shown, for example, in U.S. Pat. No. 4,227,098, dated Oct. 7, 1980, The photovoltaic generator which is used in such photovoltaic isolators must have a relatively high output so that immediately upon the energization of the LED, a sufficiently high output will be produced from the photovoltaic stack to provide the gate power needed to drive the gates of control devices such as MOSFETs or bipolar transistors, or the like.

Photovoltaic generators are known which consist of a dielectrically isolated group of photovoltaic generators spaced over the surface of a dielectric support and electrically connected in series with one another. A photovoltaic generator of this type is shown in above-mentioned U.S. Pat No. 4,227,098. Such devices are commercially available. Dielectrically isolated, laterally spaced and series-connected photogenerator cells have the disadvantage that only a small volume, which may be only about 1 mil deep can be used for collection of generated minority carriers and low lifetime material is used. Also, the electrode system for connecting the devices in series blocks incident light. Consequently, the output current of such devices is limited. Moreover, the devices employ a relatively complex structure and are expensive to manufacture.

Photovoltaic generators have also been made of a stack of series-connected wafer elements which each have PN junctions therein arranged in the same forward conduction direction. These devices can be cut into small slabs which can be edge illuminated to produce an output voltage across terminals connected at the two ends of the stack. A device of this type is shown in U.S. Pat. No. 3,422,527, issued Jan. 21, 1969 to J. M. Gault and assigned to the assignee of the present application. Other examples of edge illuminated slabs for use as photogenerators are contained in U.S. Pat. Nos. 3,617,825, 3,653,971, 4,082,570 and 4,174,561.

An edge illuminated stack of cells is inherently superior to dielectric isolated cells since light can go as deep as desired into the slab and the carriers produced will still be collected even if they are formed, for example, 5 mils from the collecting junction. Moreover, with edge illuminated slabs, the electrical contacts between adjacent units are out of the light path.

In prior art edge illuminated arrangements used as photovoltaic generators, the output current power is limited. Thus, such devices have not been efficient enough to rapidly charge a MOSFET gate capacitance to reach a turn-on threshold voltage in a very short time. Commonly, the individual wafers of such devices employ an N type body with a shallow P type diffusion to form the collection junction. Also, relatively thick wafers have been used so that the final stack has a very large height which is difficult to illuminate evenly by a single LED located at the center of the stack.

BRIEF DESCRIPTION OF THE INVENTION

In accordance with the present invention, a novel photovoltaic stack is provided which has an exceptionally high output voltage and current while employing relatively few wafers in the stack to make a relatively short height stack. In accordance with one aspect of the invention, an extremely high resistivity P type body is used. A thin N+ layer on the body then forms the collection junction in the body. By using a P type body having a thin N+ layer to form the collection junction, minority carriers in the P type body are electrons. Such carriers have a higher mobility than holes which are the minority carriers in the conventional N type body.

Preferably, the body material has the highest possible lifetime and the P type body material resistivity will be much greater than about 5 ohm centimeters, for example, 30 to 50 ohm centimeter material formed from float zone drawn crystal ingots. This is to be contrasted to the conventional use of 1 to 5 ohm centimeter material which has been used in conventional P type solar cells. Use of the lower resistivity material was known to produce a higher output voltage but, in the applications of the present invention, it is possible to reduce output voltage in favor of the higher short circuit current obtained by using higher resistivity materials.

For a further feature of the invention, the individual semiconductor wafers are as thin as possible consistent with their being handled without excessive breakage. The novel process of the invention makes the use of such very thin wafers possible since wafer grinding, which applies stress to the stack, may be the last process step before alloying. In fact, the wafers are made thinner than the diffusion length of carriers which are produced in the wafer. This can be done since a novel P+ layer is placed atop the P(−) body to serve as a reflecting layer which reflects minority carriers already collected by the PN junction.

As another feature of the invention, an N+ layer of extremely high conductivity is employed on one side of the P(−) body. The use of a very heavily doped N+ layer permits the use of an aluminum or aluminum silicon eutectic foil for alloying the stack together without converting the N+ layer to a P type region. The N+ diffusion is preferably carried out with a phosphorus impurity. The phosphorus will act as a gettter for metal ions within the wafer and thus further increases the lifetime of the material.

The reflection P+ layer previously described, as well as the N+ layer, are preferably formed by well controlled diffusion processes which are well known such as those employing predepositions with $POCl_3$ and BN.

As pointed out above, the stack is connected together by the alloying of a thin aluminum or aluminum eutectic foil between adjacent semiconductor wafers. If desired, however, a metal impregnated epoxy or polyimid can be used to connect together the stack. This would permit the use of shallower junctions and thus an even shorter height stack.

When wafers are processed as described above, their individual outputs are sufficiently high that a stack of less than about 20 devices, and preferably only about ten devices is needed to produce a suitable output current and voltage sufficiently high to rapidly turn on a power MOSFET.

BRIEF DESCRIPTION OF THE DRAWINGS

FIG. 1 is a top view of a single wafer of monocrystalline silicon which is employed for the wafers of the present invention.

FIG. 2 is a cross-sectional view of FIG. 1 taken across the section line 2—2 in FIG. 1.

FIG. 3 shows the wafer of FIG. 2 after oxidizing of its surfaces and the formation of a photoresist mask on one surface.

FIG. 4 shows the wafer of FIG. 3 after the removal of the oxide layer from one surface of the wafer.

FIG. 5 shows the wafer of FIG. 4 after a P type diffusion into the unmasked surface of FIG. 4.

FIG. 6 shows the wafer of FIG. 5 after a photoresist mask is applied to one surface and the oxide layers removed from the other surface.

FIG. 7 shows the wafer of FIG. 6 after the formation of a very high concentration N+ region into the exposed surface of the wafer of FIG. 6.

FIG. 8 shows the wafer of FIG. 7 after all oxide is stripped from the wafer.

FIG. 9 shows a stack of wafers, each identical to that of FIG. 8, with interposed aluminum eutectic foils and with aluminum contacts on the opposite ends of the stack.

DETAILED DESCRIPTION OF THE DRAWINGS

Figure 10:
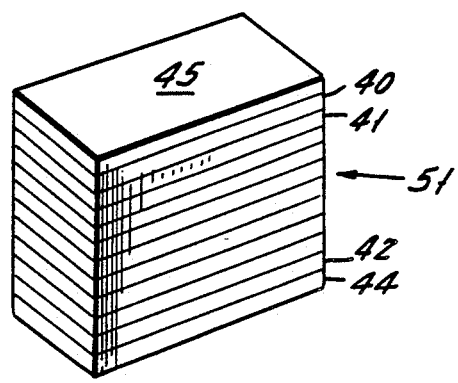
FIG. 10 shows a single slab or stack having the shape of a parallelepiped which has been cut from the stack of FIG: 9 after the stack has been alloyed together.

Referring first to FIGS. 1 and 2, there is shown therein the starting wafer for making the photogenerating wafer which will be employed in a stack. The relative dimensions of the wafers of FIGS. 1 and 2, as well as later figures, are exaggerated out of proportion for the sake of clarity. The wafer of FIG. 1 is preferably of extremely high resistivity P type material and the wafer is as thin as possible while being sufficiently strong to resist breakage under careful handling. For example, the wafer of FIGS. 1 and 2 is cut from an ingot formed by float zone crystal growth techniques and has a P type resistivity of approximately 50 ohm centimeters. This is about the highest practical value which can be obtained and should be contrasted to conventional P type solar cell material which is from 1-5 ohm centimeters. The use of very high resistivity material reduces the output voltage of each cell which is ultimately produced from the wafer, but a higher short circuit current will be available.

The wafer employed has a diameter of about 2 inches and has a thickness of about 7 ½ mils which is the thinnest that can be handled in a commercial process without excessive breakage. Larger wafer diameters, for example, 3 inches could be used but the thickness of the larger wafers would have to be increased, for example to 9 mils.

The top and bottom surfaces of the wafer 20 of FIGS. 1 and 2 are oxidized by grown oxide layers 21 and 22 which have a thickness of about 0.4 microns each. A conventional photoresist mask layer 23 is then formed atop the oxide layer 22 in FIG. 3. The wafer is conventionally etched to remove the unmasked oxide layer 22 while leaving the oxide layer 21 intact, as shown in FIG. 4.

Thereafter, a boron containing carrier is deposited at least on the bottom unexposed surface of the wafer 20 in FIG. 4 and boron is then driven into the wafer to form the P+ region 30 shown in FIG. 5. The drive used is a 10 hour drive at 1,250° C. and until the boron diffuses to a depth of about 1 mil. The drive in FIG. 5 is carried out until a surface resistivity of about 50 ohms per square is reached. Note that the oxide layer 21 acts as a mask during the boron predeposition and drive processes. Also, during the boron drive, a layer of oxide 31 having a thickness of about 1 micron will grow on the bottom surface of the wafer in FIG. 5.

Thereafter, and as shown in FIG. 6, a photoresist layer 32 is applied over the surface of oxide layer 31 and the unmasked oxide layer 21 is removed from the upper surface of the wafer in FIG. 6.

Thereafter, an extremely heavy N+ predeposition and drive using a $POCl_3$ source is used to form an N+ region 33 in the unmasked surface. To diffuse the N+ region 33 into the upper surface of wafer 20, a phosphorus source material is predeposited on the wafer at 1,125° C. for two hours and until the sheet resistance measured is about 0.8 ohm per square. Thereafter, the impurity is driven for 10 hours at about 1,200° C. This drives the N+ region 33 to a depth of about 1 mil. The drive is discontinued when the resistivity at the N+ surface of the wafer is about 0.5 ohm per square. Note that this surface resistivity of 0.5 ohm per square is extremely high and is obtained by the presence of greater than about $1 \times 10^{20}$ phosphorus ions per cubic centimeter at the wafer surface. Indeed, the phosphorus ion concentration could be as high as $2 \times 10^{20}$ ions per cc which is approximately the solid solubility limit.

This novel N+ diffusion will cause an increase in the lifetime of the P(−) region 20 since the phosphorus ions will act as a getter for metal ions in the silicon body. Moreover, the process for forming the extremely heavily doped N+ region 33 is the last process step for the formation of the junction pattern and will permit the use of an aluminum foil or an aluminum eutectic as the means for alloying together a large number of wafers into a stack. That is, the aluminum will not invert the N+ layers 33 to a P type conductivity. Thereafter, and as shown in FIG. 8, all oxides are stripped from the wafer of FIG. 7, as by the use of a 6:1 hydrogen fluoride oxide etch.

The next step in the process is the formation of the stack, wherein as shown in FIG. 9, ten wafers including wafers 40, 41 and 42 are stacked with 1 mil thick foils 43 between them. Different numbers of wafers can be stacked. Foils 43 are preferably aluminum silicon eutectic foils having 88% aluminum and 12% silicon by weight. Eight mil thick end plates 44 and 45 are stacked on the opposite ends of the stack and may be of pure aluminum. Note that if plates 44 and 45 are of aluminum silicon eutectic, the foils immediately adjacent plates 44 and 45 can be dispensed with.

The entire stack is then held under light pressure in any appropriate way and is placed in a suitable apparatus for alloying together the stack. For example, the stack can be placed in a belt furnace using a nitrogen gas purge. The furnace should be at a temperature which will produce an 800° C. peak for about 5 minutes over a total travel time through the oven of about 45 minutes. Conventional alloying furnaces can also be used.

After the stack has been alloyed, the stack is diced into slabs of a desired dimension which slabs are formed by cutting through the stack in a direction parallel to its axis. FIG. 10 shows one slab formed from the stack of FIG. 9 and which is cut by any suitable conventional single or multiple blade saw. The slab of FIG. 10 has the typical dimensions of about 20 mils wide by 60 mils long. The slab height is defined by the total height of the ten silicon wafers and connecting foils defining the slab and is approximately 100 mils. Other width and length dimensions and other numbers of wafers per stack could be used. Thus, slab elements of 40 mils by 15 mils might also be used. Note particularly, that the 100 mil height produced by the slab of ten wafers is small so that the distance from an illuminating LED which may be 30 mils from the center of the slab is not very differently spaced from any wafer element of the slab.

Figure 11:
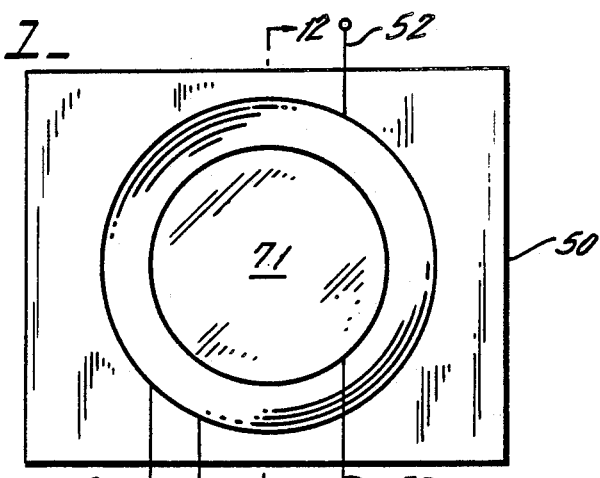
FIG. 11 is a top view of the photovoltaic isolator of FIG. 10 contained in a plastic housing.
Figure 12:
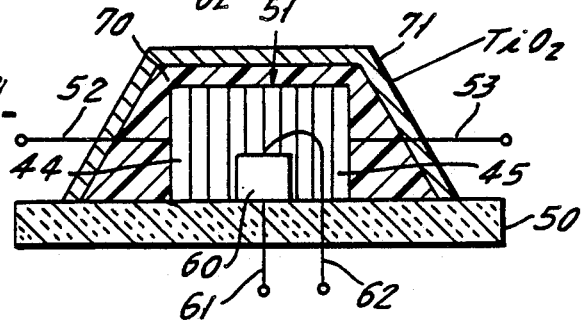
FIG. 12 is a cross-sectional view of FIG. 11 taken across the section line 12—12 in FIG. 11.

The novel photovoltaic slab of FIG. 10 can now be assembled into a photovoltaic isolator as is shown in FIGS. 11 and 12. Thus, in FIGS. 11 and 12, three is shown a support base 50 which suitably supports the slab 51 of FIG. 10 with electrodes 52 and 53 extending from the top and bottom electrodes 45 and 44 respectively. A conventional LED 60, having electrodes 61 and 62 is preferably an infrared output LED, is then seated on support 50 and is generally centered on the slab but is spaced from the slab by a sufficient distance, for example 30 mils, to produce the desired dielectric isolation (3,750 volts) between the LED electrodes and the stack electrodes. In FIGS. 11 and 12, the housing height will be slightly greater than about 60 mils, or about 3 times the thickness of the photovoltaic slab. As will be apparent to those skilled in the art, this dimensioning of housing 70 allows radiation from LED 60 to reach the upper surface of the photovoltaic slab with only a single reflection, to minimize attenuation. The diameter of the top of the housing will be about 125 mils.

The assembly is then covered with a transparent insulative silicone body 70 which is transparent to the LED radiation. The silicone body 70 is coated with a reflective coating 71. Preferably, the coating 71 consists of silicone of the same formulation as body 70, but contains a white reflective material, for example, titanium dioxide powder suspended therein. The use of silicone for suspending the powder ensures adherence of the coating 71 to the silicone body 70.

Figure 13:
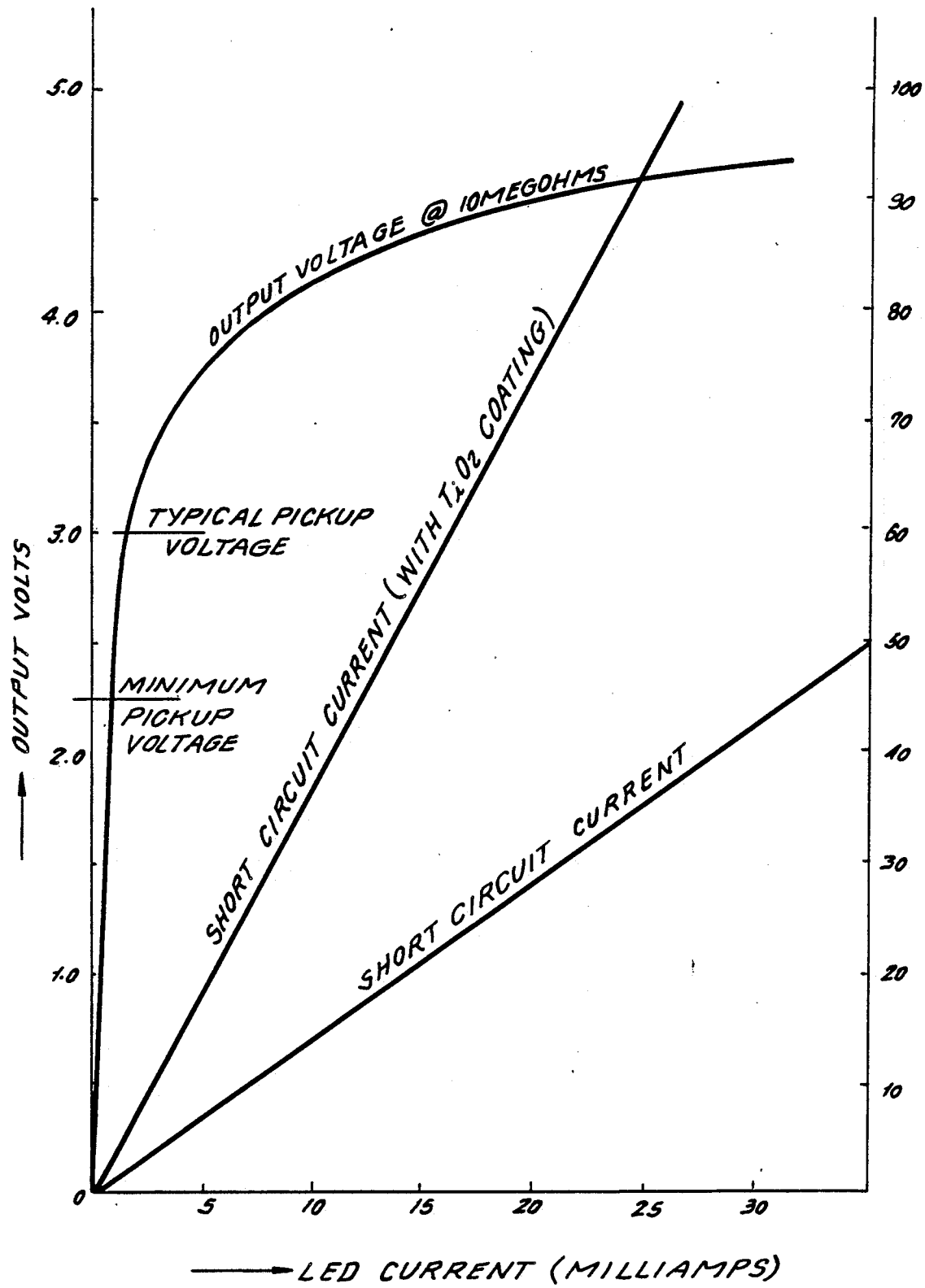
FIG. 13 shows the output voltage and output short circuit current from the stack of FIG. 10 when mounted in the assembly of FIGS. 11 and 12.

FIG. 13 shows the output voltage and current characteristics of the photovoltaic isolator of FIG. 11 and 12 which employ the slab of FIG. 10 at room temperature and with a 10 megohm load. The horizontal scale represents the input current in milliamperes to the LED 60 and thus is representative of light intensity which is applied to the exposed junction edges of the slab 51. It will be seen from FIG. 13 that the device output characteristics are far superior to those which have been obtained heretofore with photovoltaic isolators. It was found that the output voltage is not greatly affected when the output loading is reduced for example from 10 megohms to 1 megohm. Note the exceptionally rapid rise in output voltage where the output voltage almost immediately exceeds 4 volts which is a typical gate turn-on voltage for commercially available MOSFETs.

Two short-circuit current curves are shown in FIG. 13, one with the titanium oxide coating 71 of FIG. 12 in place, and the other without the coating. The short circuit current is shown on the right-hand vertical side of FIG. 13. Note that the use of the coating dramatically increases the short-circuit current since it tends to focus more photons into the photovoltaic stack. The short-circuit current with the titanium coating in place rapidly increases to greater than 90 microamperes when the LED current has exceeded about 20 milliamperes during the turn-on of the LED. It will be apparent to those skilled in the art from the curves of FIG. 13 that the novel device of the invention will supply well in excess of the necessary operation power for the very rapid operation of solid state switching devices.

Figure 14:
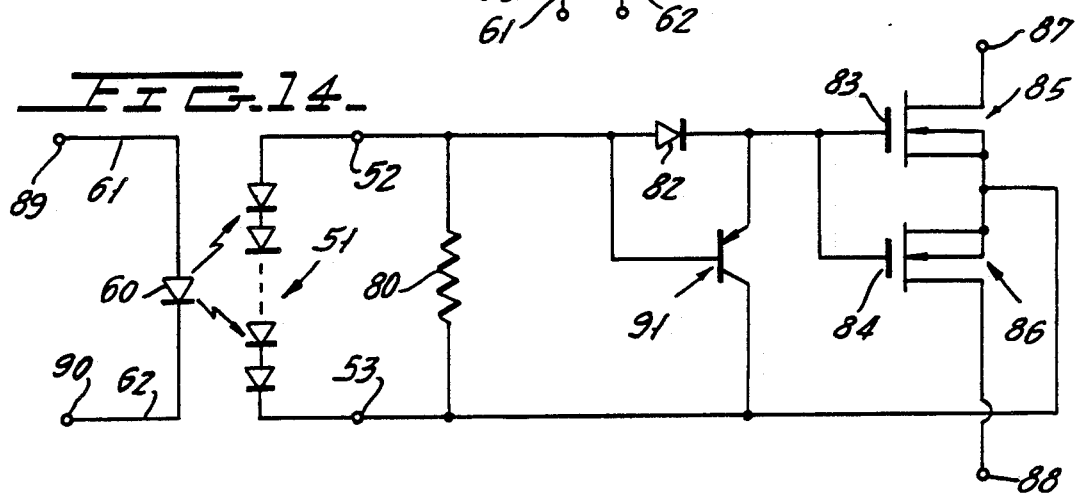
FIG. 14 is a circuit diagram of the photovoltaic isolator of the invention in a novel MOSFET relay circuit which can be driven by the photovoltaic initiator.

FIG. 14 is a circuit diagram of one solid state relay which can employ the photovoltaic isolators which have been described. Thus, in FIG. 14, the photovoltaic isolator is schematically illustrated and includes the LED 60, the photovoltaic stack 51 and their associated leads. The novel circuit of FIG. 14 can be implemented integrally within a common chip. Thus, the circuit employs an input resistor 80 which might have a resistance of 5 megohms. A diode 82 is connected from terminal 52 to the gate electrodes 83 and 84 of power MOSFET devices 85 and 86 respectively. Power MOSFETs 85 and 86 have their source and drain electrodes connected in series with one another and in series with relay output terminals 87 and 88. Note that the relay input terminals consist of terminals 89 and 90 which correspond to the terminals 61 and 62 of LED 60. A transistor 91 is provided and has its base electrode connected to the anode of diode 82 and has its emitter and collector electrodes connected respectively between the cathode of diode 82 and the junction between the power electrodes of MOSFETs 85 and 86 and to lead 53.

The operation of the novel circuit of FIG. 14 is as follows:

To turn on MOSFETs 85 and 86, it is necessary to charge the gate capacitances of the two devices through diode 82. Extremely rapid charging of the gate capacitances will be obtained in view of the unique characteristics of the photovoltaic initiator as shown in FIG. 13 and the diode 82. During charging, resistor 80 serves as a relatively high charge-up input impedance for the relay. A minimum pick-up voltage of about 2.2 volts, shown in FIG. 13, is rapidly reached and the full pick-up voltage of the MOSFET is quickly reached to turn on the device.

In order to turn off the device, the LED 60 is turned off and the voltage at the node between lead 52 and diode 82 rapidly collapses. The cathode of diode 82 then goes high and PNP transistor 91 turns on when about 0.6 volt develops across diode 82 and provides a low impedance discharge path for the power MOSFETs 85 and 86. During this time the effective input impedance of the system is the resistance of resistor 80 divided by the "beta" of transistor 91 which might be about 600. Thus, the impedance of the relay circuit is approximately 1/600th of its turn-on input impedance. Consequently, the relay circuit will rapidly turn on and will also rapidly turn off while using only a single photovoltaic source 51 for the system.

It should be noted that while the novel photoisolator of the invention is ideally applicable for driving the circuit shown in FIG. 14, it can drive any desired circuit. The device can also employ a-c inputs, as well as d-c inputs for its control. Any other type device can be driven by the optocoupler of the invention.

Although the present invention has been described in connection with a number of preferred embodiments thereof, many variations and modifications will now become apparent to those skilled in the art. It is preferred, therefore, that the present invention be limited not by the specific disclosure herein, but only by the appended claims.

What is claimed is:

1. A photovoltaic isolator comprising, in combination: an LED radiation source; a photovoltaic stack having the form of a rectangular parallelepiped and which has series connected junctions extending to the vertical side of said stack; and a housing for containing said LED and photovoltaic said stack; said LED being spaced from said photovoltaic stack by greater than about 20 mils to obtain a desired dielectric isolation between said LED and said photovoltaic stack; said LED being positioned at the center of one vertical side of said stack and arranged to illuminate at least said one vertical side of said stack; said stack having a relatively short height, less than about 150 mils to improve uniformity in illumination of said at least one vertical side of said stack by said LED.

2. A photovoltaic isolator for providing gate drive to an insulated gate of a FET-type device, comprising, in combination: an input LED radiation source; a photovoltaic stack having the form of a rectangular parallelepiped with first, second, third and fourth vertical sides and first and second electrodes on the remaining two sides of said stack, respectively; and an optically transmissive housing for containing said LED and said photovoltaic stack and providing an optical path through said housing for direct radiation from said LED to said first vertical side and for reflected radiation from said LED to said second vertical side; said LED being orthogonally spaced from said first vertical side by greater than about 20 mils to obtain a desired dielectric isolation between said LED and said photovoltaic stack; said LED being positioned at the center of said first vertical side of said stack; said housing having a sufficient height above said second vertical side to permit said second vertical side to receive reflected radiation from said LED; said stack having a relatively short height, less than about 150 mils to improve uniformity in illumination of said first vertical side of said stack by said LED; said first and second electrodes of said stack being directly connectable to an insulated gate of a FET-type device, whereby said photovoltaic stack can comprise the sole electrical power source for driving said gate.

3. The photovoltaic isolator of claim 2, wherein said stack consists of a vertical stack of a plurality of identical monocrystalline silicon chips; each of said chips comprising a thin body having flat first and second parallel surfaces; each of said chips having a main body portion of very high lifetime P type conductivity material; each of said chips having a shallow N type diffusion extending into its said first surface to a uniform depth across substantially the full surface area of said first surface; each of said chips having a shallow P+ layer of conductivity substantially higher than that of said P type body extending into its said second surface to a uniform depth across substantially the full surface area of said second surface; a plurality of high conductivity layers disposed between adjacent chips of said stack for mechanically and electrically connecting said stack together with the forward conduction directions of each of said chips being in the same direction; the edge of the junctions between said P type body and said N type layer of each of said chips being exposed along at least one portion of one surface of the vertical sides of said stack to enable the edge illumination of said stack; and first and second electrodes on the opposite ends of said stack.

4. The device of claim 3, wherein the thickness of each of said chips is less than the average diffusion length of minority carriers which are produced in said body in response to application of radiation to said vertical sides of said chip; said P+ layer acting as a reflector to reflect minority change carriers toward the collection junction formed by said P type body and said N type layer.

5. The device of claim 3 wherein each of said chips has a shallow P+ diffusion layer of conductivity substantially higher than that of said P type body extending into its second surface to a uniform depth across substantially the full surface area of said second surface.

6. The device of claim 3 or 5, wherein said N+ layer has a conductivity defined by the presence of from about $1 \times 10^{20}$ to $4 \times 10^{20}$ impurity atoms per cubic centimeter at said first surface; whereby said N+ layer will not be converted to the P conductivity type when alloyed to an aluminum foil.

7. The device of claim 3 or 5, wherein said plurality of high conductivity layers consist of a foil having a thickness of about 1 mil and is of a material selected from the group consisting of aluminum, aluminum alloys and an aluminum silicon eutectic.

8. The device of claim 7, wherein said chips have a thickness less than about 9 mils and wherein said stack consists of less than about 15 chips.

9. The device of claim 3 or 5, wherein said chips have a thickness less than about 9 mils wherein said stack consists of less than about 15 chips.

10. The device of claim 3 or 5, wherein said N+ layer is formed from a diffused phosphorus impurity; said phosphorus impurity acting as a getter to metal ions within said P type body, thereby to increase the lifetime of said P type body.

11. The device of claim 3 or 5, wherein said slab has the shape of a rectangular parallelepiped.

12. The photovoltaic isolator of claim 2, wherein said housing has a height above said second surface of about three times the height of said first side so as to increase the amount of radiation reaching said second surface from said LED that is reflected only once.

13. The photovoltaic isolator of claim 2 or 12, further including a support with a major surface which is flat, and wherein said photovoltaic stack and said LED lie atop said major surface, with said fourth vertical side of said stack lying on said major surface in confronting relation thereto.

14. The photovoltaic isolator of claim 13, wherein said optically transmissive housing adjoins said first, second and third vertical sides of said stack and optically couples said first through third vertical sides to said LED.

15. The photovoltaic isolator of claim 2 or 12, further including a reflective coating atop said optically transmissive housing.

16. The process of claim 15, wherein phosphorus is used for the impurity to form said opposite conductivity type layer, wherein said phosphorus acts as a getter to metal ions in said one conductivity type wafers, thereby to increase the lifetime of said one conductivity type body.

17. The process of claim 15 or 5, wherein said thin conductive layers consist of thin foils of a material selected from the group consisting of aluminum and aluminum containing materials.

18. The process of claim 15, wherein said reflective coating comprises titanium dioxide.

19. The process of forming a photovoltaic isolator for providing gate drive to an insulated gate of a FET-type device, the process comprising the steps of:
(a) forming a photovoltaic stack by:
  (i) diffusing a thin high conductivity layer of one conductivity type into the first surface of a plurality of wafers of said one conductivity type material;
  (ii) diffusing a thin layer of an opposite conductivity type into the opposite surface of said wafers;
  (iii) stacking less than about 20 of said wafers atop one another with the forward conduction direction of their junctions in the same direction, with thin conductive layers of connective material disposed between adjacent wafers;
  (iv) treating said stack to secure said adjacent wafers together by adherence of said layers of connective material to adjacent wafers of said stack;
  (v) cutting vertically through said stack of wafers to form a plurality of individual slabs having the shape of rectangular parallelepipeds with first, second, third and fourth successive sides and with the edge of the junctions of said wafers exposed at the sides of said slabs; and
  (vi) forming first and second electrodes on the remaining two sides of said stack, respectively; said first and second electrodes being directly connectable to an insulated gate of a FET-type device, whereby said photovoltaic stack can comprise the sole electrical power source for driving said gate;
(b) placing an LED in an orthogonally offset position from said first side; and
(c) forming an optically transmissive housing over said first and second sides of said photovoltaic stack and said LED so as to provide an optical path through said housing for direct radiation from said LED to said first side and for reflected radiation from said LED to said second side; said housing being formed with a sufficient height above said second side to permit said second side to receive a substantial amount of reflected radiation from said LED compared to the direct radiation received by said first side.

20. The process of claim 19, wherein said housing is formed to a height above said second side of about three times the height of said first side so as to increase the amount of radiation reaching said second surface form said LED that is reflected only once.

21. The process of claim 19 or 20, further including the step of placing said photovoltaic stack and said LED atop a flat surface of a substrate, with said fourth side of said stack lying atop said flat surface in confronting relation thereto.

22. The process of claim 21, further including the step of forming said optically transmissive housing additionally over said third side of said photovoltaic stack to thereby optically couple said LED to said third side.

23. The process of claim 19 or 20, further including the step of forming a reflective coating over said housing.

24. The process of claim 19 or 20, further comprising the step of forming a reflective coating over said housing which includes titanium dioxide.

25. A photovoltaic stack, comprising:
(a) a vertical stack including a plurality of identical monocrystalline silicon chips, each of the chips having:
  (i) a main body portion of P-type material with a resistivity higher than about 30 ohm-centimeters; and
  (ii) a relatively shallow diffusion layer of N+ material extending to a uniform depth in one main surface in each chip;
(b) a respective high conductivity layer disposed between each adjacent pair of chips in the stack;
(c) the edges of each junction between the P type body and the N+ layer of each chip being exposed along at least one portion of one surface of the vertical sides of the stack; and
(d) a respective electrode on each end of the stack.

26. The photovoltaic stack of claim 25, wherein the stack has the form of a rectangular parallelepiped.

27. The photovoltaic stack of claim 25, wherein said vertical stack of chips is less than about 150 mils in height.

28. The photovoltaic stack of claim 25, wherein said plurality of said chips in said vertical stack is less than about 20.

29. The photovoltaic stack of claim 25, wherein said chips have a thickness less than about 9 mils and wherein said stack consist of less than about 15 chips.

30. The photovoltaic stack of claim 25, wherein said N+ layer as a conductivity defined by the presence of from about $1 \times 10^{20}$ to $4 \times 10^{20}$ impurity atoms per cubic centimeter at said one main surface; w hereby said N+ layer will not be converted to the P conductivity type when allowed to an aluminum foil.

31. The photovoltaic stack of claim 25, wherein each of said chips has a shallow P+ diffusion layer of conductivity substantially higher than that of said main body portion of P-type material extending into a second surface in each chip to a uniform depth across substantially the full surface area of said second surface.

32. The photovoltaic stack of claim 25, wherein said respective high conductivity layer consists of a foil having a thickness of about 1 mil and is of a material selected from the group consisting of aluminum, aluminum alloys and an aluminum silicon eutectic.

33. The photovoltaic stack of claim 25, wherein said N+ layer is formed from a diffused phosphorus impurity; said phosphorus impurity acting as a getter to metal ions within said main body portion of P-type material, thereby to increase the lifetime of said main body portion.

34. A photovoltaic isolator for providing gate drive to an insulated gate of a FET-type device, comprising, in combination:
an input LED radiation source;
a photovoltaic stack comprising a vertical stack of a plurality of identical monocrystalline silicon chips, each of the chips having a main body portion of P-type material with a resistivity higher than about 30 ohm-centimeters, and a relatively shallow diffusion layer of N+ material extending to a uniform depth in one main surface in each chip; a respective high conductivity layer disposed between each adjacent pair of chips in the stack; the edge of each junction between the P-type body and the N+ layer of each chip being exposed along at least one portion of one surface of the vertical sides of the stack; said photovoltaic stack having the form of a rectangular parallelepiped with first, second, third and fourth vertical sides and first and second electrodes on the remaining two sides of said stack, respectively;

an optically transmissive housing for containing said LED and said photovoltaic stack and providing an optical path through said housing for direct radiation from said LED to said first vertical side and for reflected radiation from said LED to said second vertical side; said LED being orthogonally spaced from said first vertical side by greater than about 20 mils to obtain a desired dielectric isolation between said LED and said photovoltaic stack; said LED being positioned at the center of said first vertical side of said stack; said housing having a sufficient height above said second vertical side to permit said second vertical side to receive reflected radiation from said LED;

said stack having a relatively short height, less than about 150 mils to improve uniformly in illumination of said first vertical side of said stack by said LED; and said first and second electrodes of said stack being directly connectable to an insulated gate of a FET-type device, whereby said photovoltaic stack can comprise the sole electrical power source for driving said gate.

35. The photovoltaic isolator of claim 34, wherein said housing has a height above said second surface of about three times the height of said first side so as to increase the amount of radiation reaching said second surface from said LED that is reflected only once.

36. The photovoltaic isolator of claim 34, further including a support with a major surface which is flat, and wherein said photovoltaic stack and said LED lie atop said major surface, with said fourth vertical side of said stack lying on said major surface in confronting relation thereto.

37. The photovoltaic isolator of claim 36, wherein said optically transmissive housing adjoins said first, second and third vertical sides of said stack and optically couples said first through third vertical sides to said LED.

38. The photovoltaic isolator of claim 34, further including a reflective coating atop said optically transmissive housing.

39. The photovoltaic isolator of claim 38, wherein said reflective coating comprises titanium dioxide.

40. The photovoltaic isolator of claim 34, wherein said N+ layer has a conductivity defined by the presence of from about $1 \times 10^{20}$ to $4 \times 10^{20}$ impurity atoms per cubic centimeter at said first surface; whereby said N+ layer will not be converted to P conductivity when alloyed to an aluminum foil.

41. The photovoltaic isolator of claim 34, wherein said respective high conductivity layers each consists of a foil having a thickness of about 1 mil and is of a material selected from the group consisting of aluminum, aluminum alloys and an aluminum silicon eutectic.

42. The photovoltaic isolator of claim 34, wherein said chips have a thickness less than about 9 mils and wherein said stack consists of less than about 15 chips.

43. The photovoltaic isolator of claim 34, wherein said N+ layer is formed from a diffused phosphorus impurity; said phosphorus impurity acting as a getter to metal ions within said P type body, thereby to increase the lifetime of said P type body.

* * * * *